US006548892B1

(12) United States Patent
Steiner et al.

(10) Patent No.: US 6,548,892 B1
(45) Date of Patent: Apr. 15, 2003

(54) LOW K DIELECTRIC INSULATOR AND METHOD OF FORMING SEMICONDUCTOR CIRCUIT STRUCTURES

(75) Inventors: Kurt George Steiner, Orlando, FL (US); Susan Clay Vitkavage, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/653,297

(22) Filed: Aug. 31, 2000

(51) Int. Cl.[7] .............................................. H01L 23/12
(52) U.S. Cl. ...................................... 257/701; 257/702
(58) Field of Search ................................. 438/788, 695, 438/787; 257/701, 702, 703

(56) References Cited

U.S. PATENT DOCUMENTS 6,127,285 A  * 10/2000 Nag ........................... 438/788

FOREIGN PATENT DOCUMENTS

| EP | 1 054 444 A1 | 5/1999 | ......... H01L/21/316 |
| EP | 1 128 421 A2 | 2/2001 | ......... H01L/21/316 |

* cited by examiner

*Primary Examiner*—Roy K Potter
(74) *Attorney, Agent, or Firm*—Ferdinand M. Romano

(57) ABSTRACT

A porous insulator material and method of manufacturing. The material comprises oxygen, silicon and hydrogen characterized by a density less than 2 g/cc. Alternately, the porous insulator material is characterized by a refractive index less than 1.45 for light at a wavelength between 633 nm and 673 nm, or by a Young's modulus less than 45 GPa. A method for manufacturing a semiconductor device includes providing a semiconductor layer with an upper surface for device formation and forming multiple levels of interconnect over the semiconductor layer, each level including a plurality of members. The members are electrically isolated from other members by decomposition of TEOS to form a porous layer between at least some of the members.

30 Claims, 6 Drawing Sheets

LOW K DIELECTRIC INSULATOR AND METHOD OF FORMING SEMICONDUCTOR CIRCUIT STRUCTURES

FIELD OF THE INVENTION

The present invention relates to provision of insulator materials having improved dielectric and mechanical properties for semiconductor manufacturing. More specifically, the invention relates to novel materials and methods for applying such materials in the manufacture of semiconductor electronic products.

BACKGROUND OF THE INVENTION

As the density of semiconductor process integration continues to increase the aggregate amount and compactness of multilevel interconnect on complex integrated circuits is also escalating. With feature sizes and spacings becoming smaller, the speed of a semiconductor device is becoming less dependent on the switching characteristics of individual transistors and more dependent on electrical properties of the interconnect structure. Specifically, because the speed of a signal propagating on interconnect circuitry varies inversely with line resistance and capacitance, semiconductor interconnect requirements are presently considered one of the most demanding aspects of ultra large-scale integration (ULSI) efforts. That is, conductors providing lower resistivity are sought to increase current density, and insulator materials having lower dielectric constants are desired to reduce circuit capacitance.

Thus, as devices of growing complexity are manufactured at smaller geometries, there is motivation to use Cu metallization schemes instead of Al interconnect and efforts have been undertaken to find substitutes for silicon oxide-based insulators. Note, silicon oxides, among the most common of insulator materials used in semiconductor devices, have a dielectric constant of 3.9 or higher (relative to free space), the value depending in part on moisture content.

It is becoming necessary to develop new insulator materials having lower dielectric constants in order to maintain and improve electrical performance characteristics. In particular, efforts to reduce resistance-capacitance (RC) time delays and capacitive coupling have resulted in greater use of so-called "low k" dielectrics, i.e., insulative materials characterized by relatively low dielectric constants relative to silicon oxides.

As geometries have extended below the 0.25 micron regime and move toward 0.1 micron, the thermal and mechanical properties of low k dielectrics are of limited compatibility with current manufacturing processes, e.g., chemical-mechanical polishing (CMP). For example, due to desired porosity which helps decrease the dielectric constant, the formation of these materials on a semiconductor structure has resulted in mechanical properties that are not well-suited for CMP. That is, the dielectric material, which is typically spun-on (in the case of a polymer) or deposited (if an inorganic dielectric), is known to be a relatively soft or flaky material such that there is insufficient control during the polish step.

Accommodations to bring soft and flaky low-k dielectrics into volume manufacture include depositing a more rugged cap dielectric material over the low k material in order to utilize established process equipment. For example, hydrogen silsesquioxane (k=3, approx., relative to free space), a strong candidate for replacing silicon dioxide, has high thermal stability, excellent gap-fill properties, and low current leakage. Nonetheless, because the material is not suitable for standard CMP, volume manufacture has required that an overcoat of silicon oxide, formed by Plasma Enhanced Chemical Vapor Deposition (PECVD), be applied prior to the CMP operation and polishing is limited to this cap layer. Also, although use of a cap material will permit CMP processing, this may at times be sub-optimal for high performance circuitry. That is, having a significantly higher dielectric constant, the cap oxide can influence electrical circuit properties. On the other hand, provisions of a low k dielectric material which does not require a cap oxide can result in a simpler process for manufacturing semiconductor devices and enable improved circuit performance at lower cost.

Two of the most important properties for successful implementation of low k materials in processes below 0.2 micron are adhesion (to dissimilar materials) and mechanical toughness (for CMP). Certain forms of hydrogen silsesquioxane can exhibit dielectric constants of approximately 1.5 by controlling the void volume. They also exhibit relatively good adhesion to other materials such as metal bond pads and differing dielectric materials. Of course these favorable results may depend largely on optimized process conditions, e.g., the satisfactory cleaning of surfaces prior to formation of the dielectric thereon, but these characteristics appear attainable in a volume manufacturing environment. In contrast to the advancements made in performance and materials compatibility, manufacturable solutions which accommodate the mechanical properties of low k dielectrics have been generally limited to provision of oxide cap polishing layers. A low-k dielectric material which does not require provision of a relatively hard cap layer having a high dielectric constant thereon will simplify manufacture and improve performance of multi-level interconnect schemes.

SUMMARY OF THE INVENTION

Generally, a solution to the aforementioned problems is now provided by a material having both a low dielectric constant and mechanical properties suitable for CMP operations. The invention enables relatively simple and cost efficient placement of insulative material having a low dielectric constant between interconnect members of a circuit structure. According to one embodiment of the invention a porous insulator material comprises oxygen, 25 to 35 atomic percent silicon and 5 to 15 atomic percent hydrogen, and has a density less than 2 g/cc. Alternately, a layer, with oxygen, silicon and hydrogen in the stated compositional ranges, has a refractive index less than 1.45 for light at a wavelength between 633 nm and 673 nm.

In other embodiments, a device is formed along a surface of a semiconductor layer with an interconnect structure providing electrical contact to the transistor device. The interconnect structure includes first and second conductive elements and a dielectric layer positioned to provide isolation between portions of the conductive elements. The dielectric layer, comprises oxygen, at least 25 atomic percent silicon and 5 to 15 atomic percent hydrogen and has a refractive index less than 1.45 for light at a wavelength between 633 and 673 nm. In another form of the invention, a dielectric layer having oxygen, silicon and hydrogen in the stated compositional ranges has a wet etch ratio relative to thermally grown silicon dioxide ranging from 4:1 to 20:1 in an etchant comprising dilute HF.

There is also provided an embodiment with a semiconductor structure including a first upper level of interconnect members formed over a semiconductor layer, at least one lower level of interconnect members formed between the semiconductor layer and the first upper level, and a porous layer of insulative material comprising: oxygen; at least 25 atomic percent silicon; and 5 to 15 atomic percent hydrogen. The porous layer is characterized by a Young's modulus less than 45 GPa and is positioned to electrically isolate members of the first upper level from members of the lower level. Alternately the porous layer is characterized by a density less than 2 g/cc.

According to one embodiment of a method for manufacturing a semiconductor device, a semiconductor layer has an upper surface and multiple levels of interconnect are formed over the semiconductor layer, each level including at least one conductive member. The members are electrically isolated from other members by decomposition of TEOS to form a dielectric layer of density less than 2 g/cc between the members.

Also according to the invention, a porous layer of insulative material is formed between two levels of interconnect members on a semiconductor structure. The layer includes oxygen, at least 25 atomic percent silicon and 5 to 15 atomic percent hydrogen. In one form the layer includes a continuous distribution of voids throughout the majority of the layer volume.

BRIEF DESCRIPTION OF THE DRAWINGS

The foregoing summary has outlined general features of the invention. A more complete understanding of the invention will be acquired from the detailed description which follows when read in conjunction with the accompanying drawings. In the drawings.

Like numbers denote like elements throughout the figures and text. Features presented in the drawings are not to scale.

DETAILED DESCRIPTION

Figure 1:
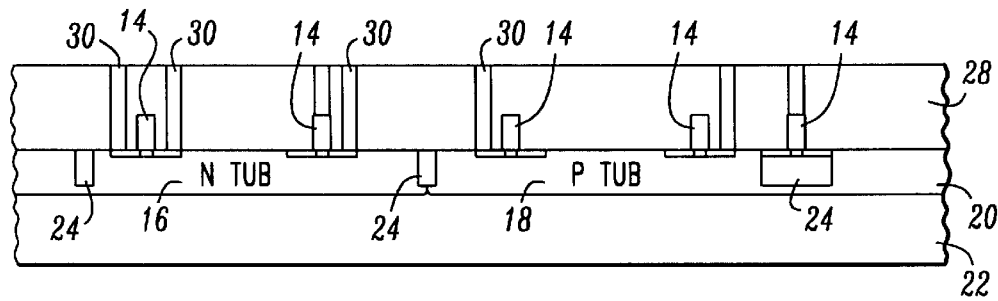
FIGS. 1–8 illustrate in cross section a portion of a semiconductor circuit structure at intermediate phases of fabrication wherein the invention is applied to a subtractive metal etch process.

As used herein the term metallization or metallization structure means a plurality of conductive elements or interconnect members configured to support implementation of one or more circuit functions. In complex circuit designs metallization structures comprise levels, or stages, of sequentially formed layers from which conductive elements are created and isolated from one another. Conductive elements of one layer are commonly connected to conductive elements of one or more other layers through via contacts or conductive plugs in order to effect the circuit function.

The term level of metallization as used herein means a plurality of conductive elements or interconnect members formed during the same sequence of processing, e.g., a stage of photolithography and associated etch techniques, to provide a network of elements, some of which are electrically isolated from one another. The conductive elements may comprise polysilicon, Al, Cu, or other material, may be an alloy and may include a silicide to reduce sheet resistance. Commonly, the elements provide electrical connection between conductive regions, e.g., a transistor electrode and a voltage source, but the elements may provide connection between spatially distant features formed on the same metallization level. Accordingly, a multi-level interconnect structure is a metallization structure comprising multiple levels of metallization. The assemblage of such elements is sometimes referred to as wiring or an interconnect system.

The invention may be applied to a wide variety of semiconductor designs, including those providing discrete transistor functions, power operations, or low power functions. In preferred embodiments the invention is applied to integrated circuit structures having four or more levels of metallization. For simplicity of presentation, the illustrated embodiments show four levels of metallization, but it will be apparent from the teachings set forth below how the same principles can be readily applied to five, six, seven and more levels of metallization.

Numerous methods are commonly available to form the silicon oxides that electrically isolate conductors from one another in multilevel interconnect systems. Tetraethyl orthosilicate, or TEOS, $Si(OC_2H_5)_4$, is a widely used precursor in formation of silicon oxide for such applications. Decomposition of vaporized liquid TEOS to form a silicon oxide film typically occurs by low pressure (subtorr) chemical vapor deposition (CVD) between 650 C. and 750 C. Such TEOS-based depositions are known to provide good uniformity and step coverage. Generally, the deposited film is understood to be a non-stoichiometric oxide of silicon, although it is often referred to as silicon dioxide. In an oxygen-rich environment, inclusion of ozone ($O_3$), e.g., up to 10 percent of the reacting oxygen, lower temperature depositions result in good conformal properties, low viscosity and improved gap-filling features. A typical reaction environment is at 400 C. and 300 Torr with 4 standard liters per minute (slm) oxygen (the oxygen comprising 6 percent ozone), 1.5 slm He and 300 standard cubic centimeters per minute (sccm) TEOS. Under these conditions the deposition rate ranges between 50 Å/sec (5 nm/sec) and 120. Å/sec (12 nm/sec). The TEOS may be delivered in either a liquid or vapor phase. Commonly, the TEOS is injected into the He stream and then mixed with $O_3/O_2$ in proximity to the reactor chamber. The deposited dielectric has a characteristic density upward from at least 2.2 g/cc and a dielectric constant (relative to free space) of about 4.3 at 100 hz. The gap-fill properties are suitable for regions between closely spaced members on the same level of metallization.

The present invention is generally referred to herein as porous insulator and, in a preferred embodiment, is referred to as a silicon oxide layer. The invention is based on principles discovered during evaluation of the above-referenced reactions for conventional post metallization gap fill applications, i.e., formation of insulator layers after each metal level is formed. Through experiment it was determined that the properties of ozone-reacted TEOS, as well as properties of the resulting oxide layer, can be significantly altered by modifying the deposition conditions. It is believed that varying the physical or electrical properties along or about the deposition surface may reduce both the deposition rate and the density of TEOS-deposited films. Generally it is now apparent that certain factors can limit the ability of the TEOS reaction products to deposit in a conventional, relatively dense film along the deposition surface. In the past such factors might have been regarded as problematic but it is presently recognized that these same factors may be controlled to facilitate formation of voids in the deposited film, thereby providing a relatively porous, low density, silicon oxide film. By porous, it is meant that the deposited material comprises voids which may, but do not necessarily, permit gaseous diffusion. Preferably the voids are essentially closed pores.

It is also believed that, because of the low-density, porous nature, this film of oxide material has a relatively low dielectric constant in comparison to the afore-described conventional TEOS-deposited films as well as many other silicon oxide films. And in contrast to other low k dielectric materials, this TEOS-deposited, porous insulator also has mechanical properties suitable for CMP.

By way of example, suitable deposition properties for achieving a low k TEOS-deposited film over a silicon oxide surface are had by: (1) passivating the silicon oxide deposition surface with a thin layer, e.g., as little as a monoatomic layer, of silicon nitride; and (2) modifying the conventional reaction environment by increasing the ozone concentration (relative to oxygen) to 10 percent or more and, preferably, to about 12 percent or more.

Figure 8:
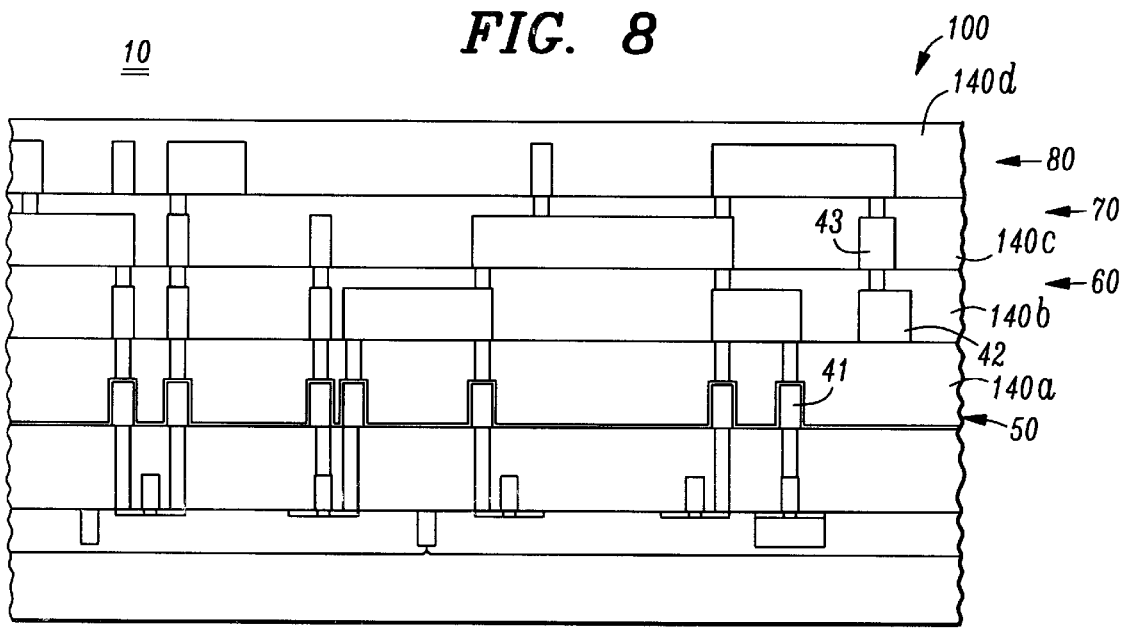
Figure 9:
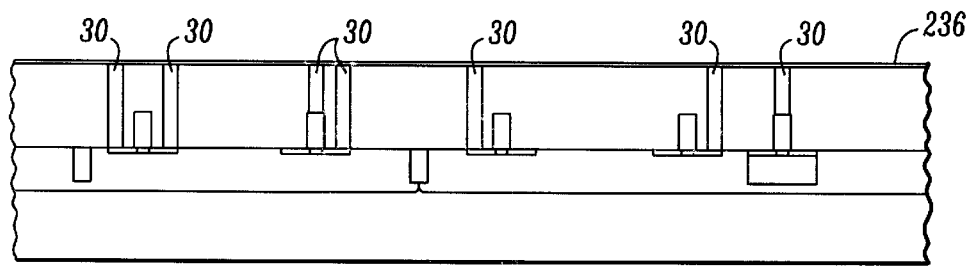
FIGS. 9–19 illustrate in cross section a portion of a semiconductor circuit structure at intermediate phases of fabrication wherein the invention is applied to a dual Damascene process.
Figure 10:
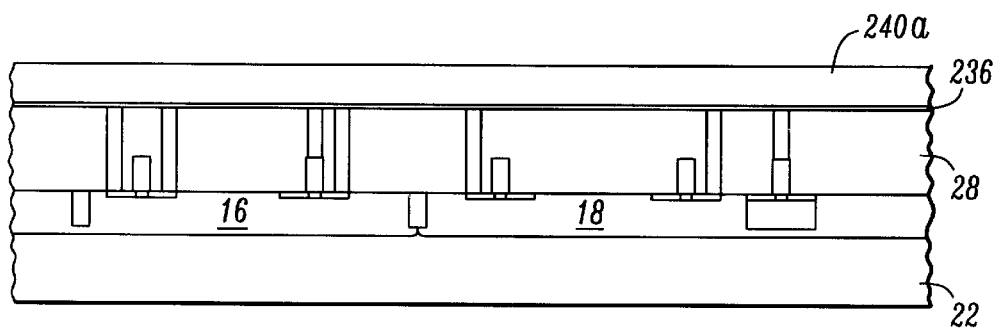
Figure 11:
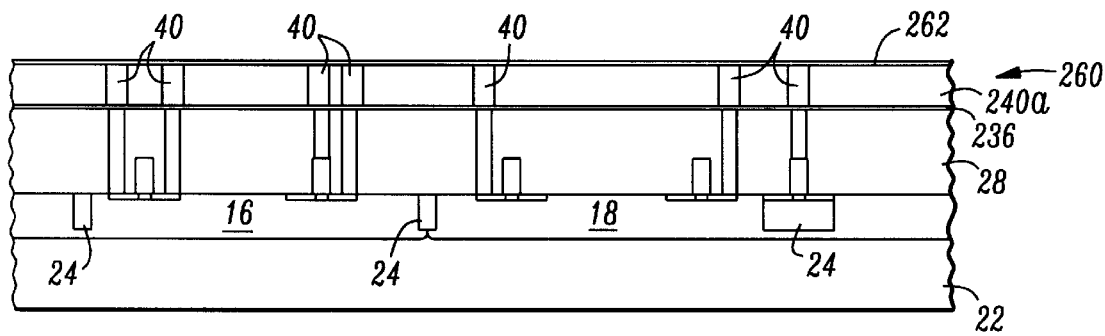
Figure 12:
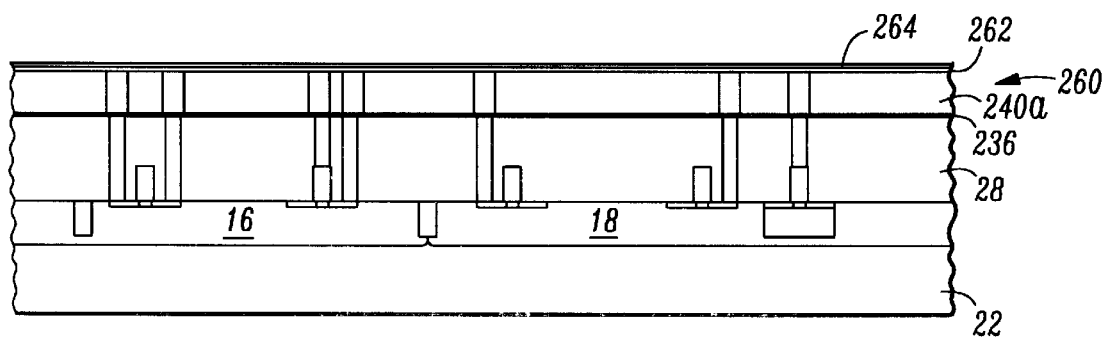
Figure 13:
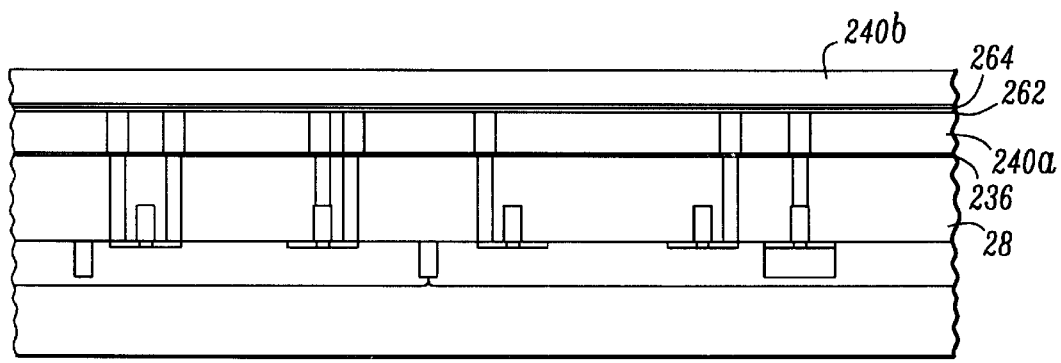
Figure 14:
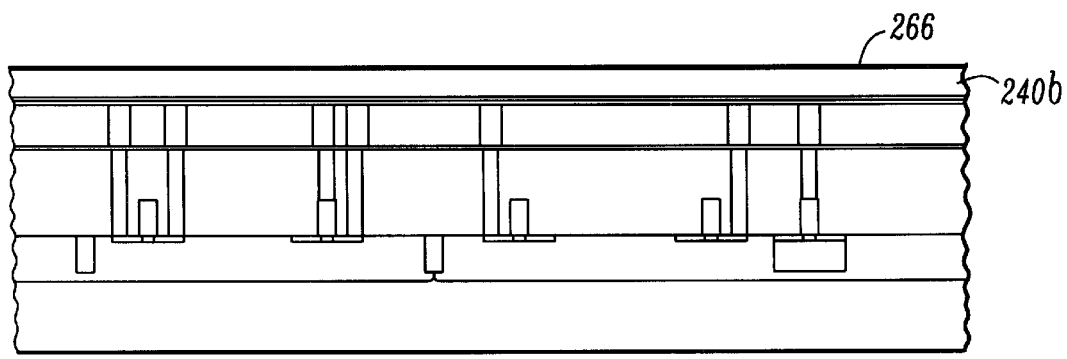
Figure 16:
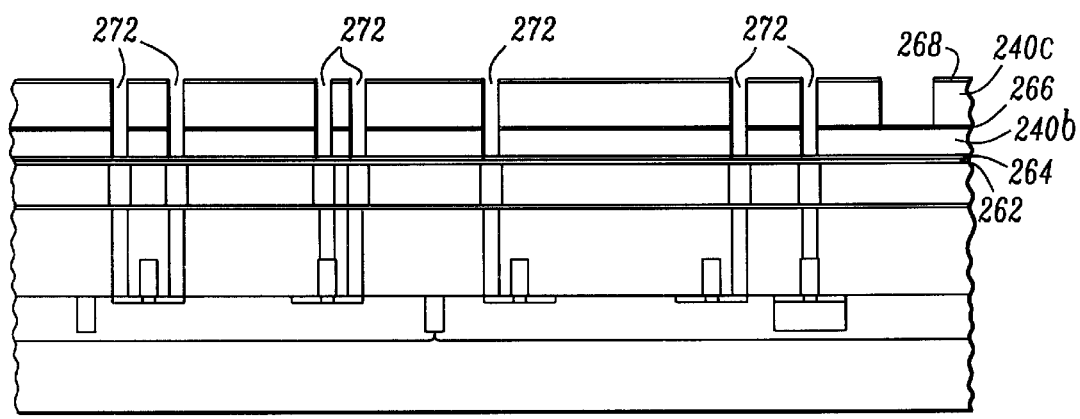
Figure 17:
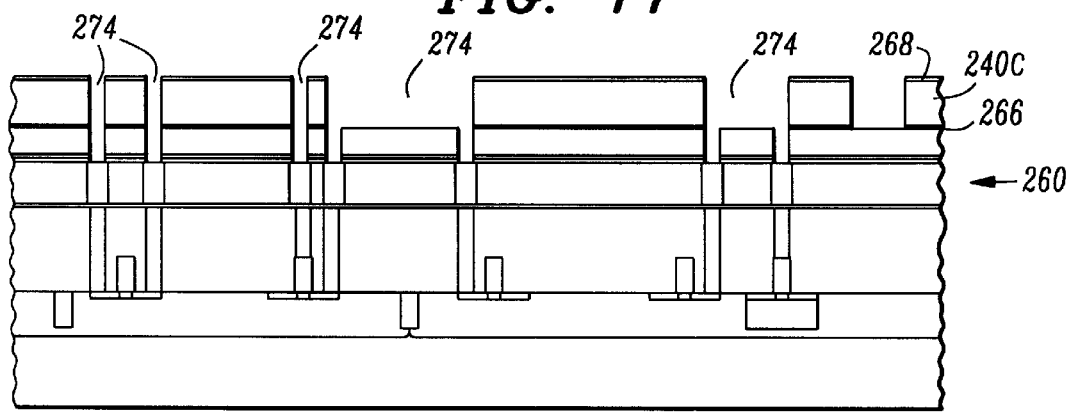
Figure 18:
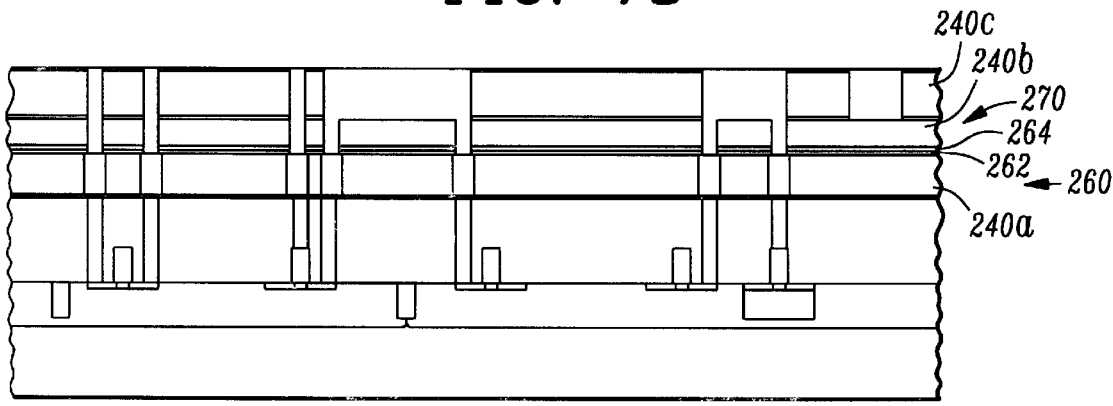

Referring initially to FIGS. 8 and 16 there are shown in partial cross sectional views two exemplary circuit structures incorporating principles of the invention. FIG. 8 illustrates a near-complete multi-level interconnect structure 100 formed with a subtractive metal etch process. FIG. 16 illustrates a near-complete multi-level interconnect structure 200 formed with a dual Damascene process. While the figures and process descriptions which follow illustrate specific applications of a TEOS-deposited low k dielectric, the embodiments are merely exemplary. The invention is particularly useful for complex CMOS structures as depicted herein, but is not at all limited to MOS devices or even silicon structures. Bipolar, BICMOS and compound semiconductor structures with multiple levels of circuit interconnect could incorporate the same concepts. Similarly the interconnect structure is not limited to specific types or combinations of materials. Al and Cu alloys are preferred over silicides, although combinations of these and other materials may provide suitable levels of conductance for specific circuit applications.

With reference to FIG. 1, an integrated circuit structure 10 is illustrated as a starting point for formation of the FIG. 8 structure 100 as well as a starting point for formation of the FIG. 16 structure 200. The structure 10 comprises a plurality of conventionally formed CMOS transistor devices 14 fabricated in n-type regions 16 and p-type regions 18 along the surface 20 of a silicon layer 22. Shallow trench isolation regions 24 are formed on the silicon layer 22.

The exemplary devices 14 are Metal Oxide Silicon Field Effect Transistors (MOSFETs) and are not described in detail. Those familiar with such structures will readily recognize that the devices 14 include conventional source, channel and drain regions as well as gate regions. The MOSFET gate region is typically a polysilicon layer over a dielectric layer with sidewall dielectric filaments formed thereabout. To form the structure 100, a silicon oxide layer 28 is deposited by chemical vapor deposition (CVD) over the transistor devices 14. The contacts 30 are conventionally formed therein to provide connection between, among other features, various transistor regions and the yet-to-be formed first level of metallization. The contacts 30 are formed in vias by first depositing a Ti barrier layer, approximately 600 Å (60 nm) at 400 C. followed by depositing approximately 750 Å (75 nm) of TiN (also at 400 C.) and then annealing. Next 4000 Å (400 nm) of W is deposited at 425 C. and the structure is polished as necessary to remove W from over the silicon oxide layer 28 and provide sufficient planarity prior to formation of the first level of metallization.

Figure 2:
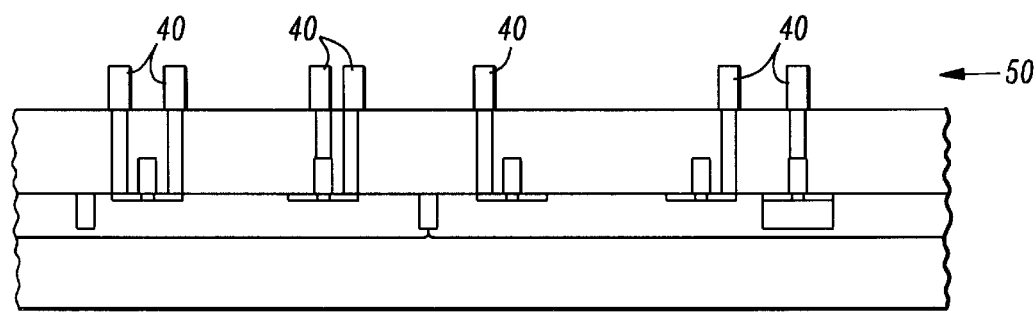
Figure 3:
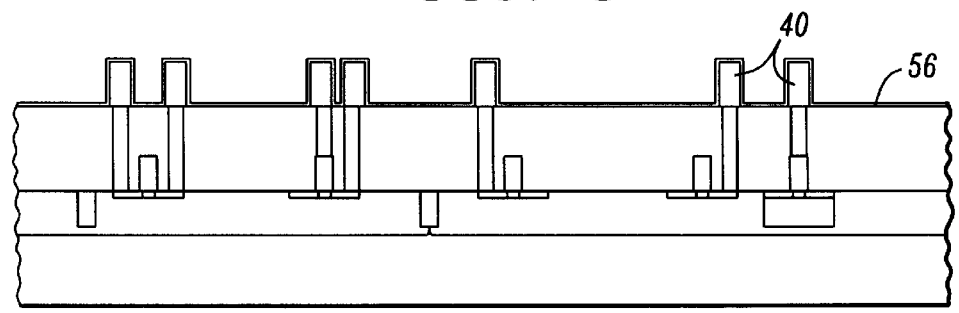
Figure 4:
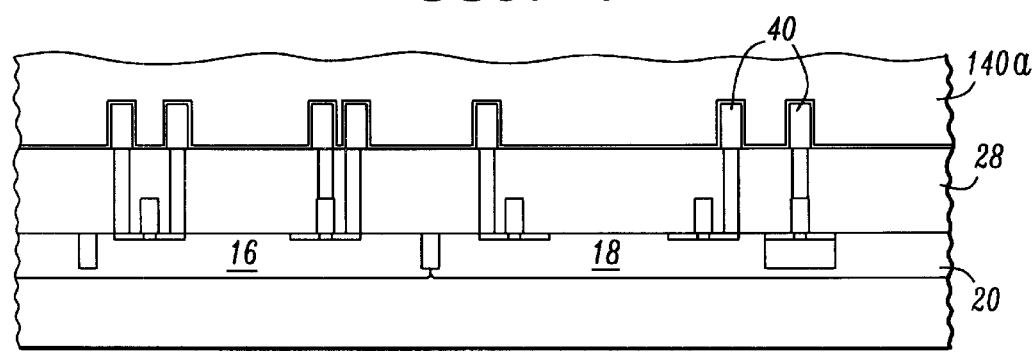
Figure 5:
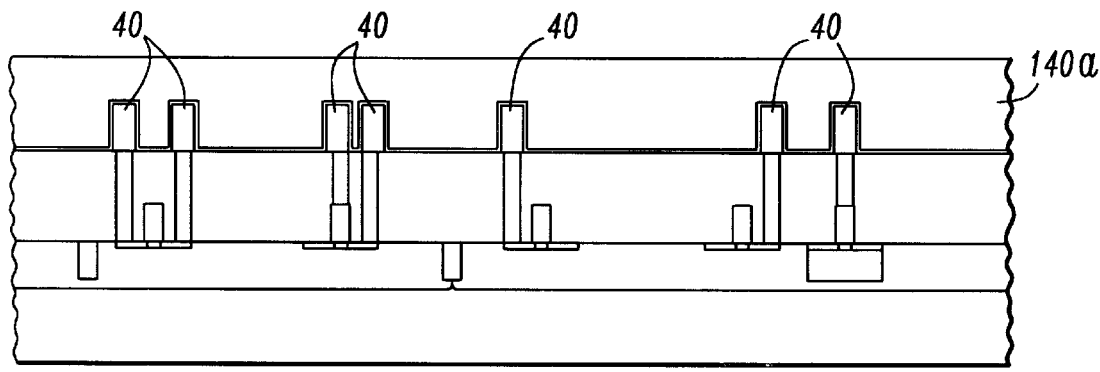
Figure 6:
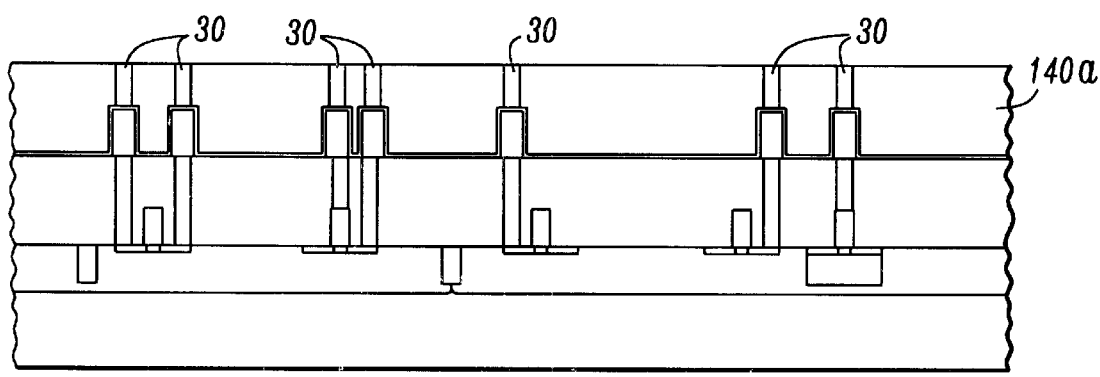
Figure 7:
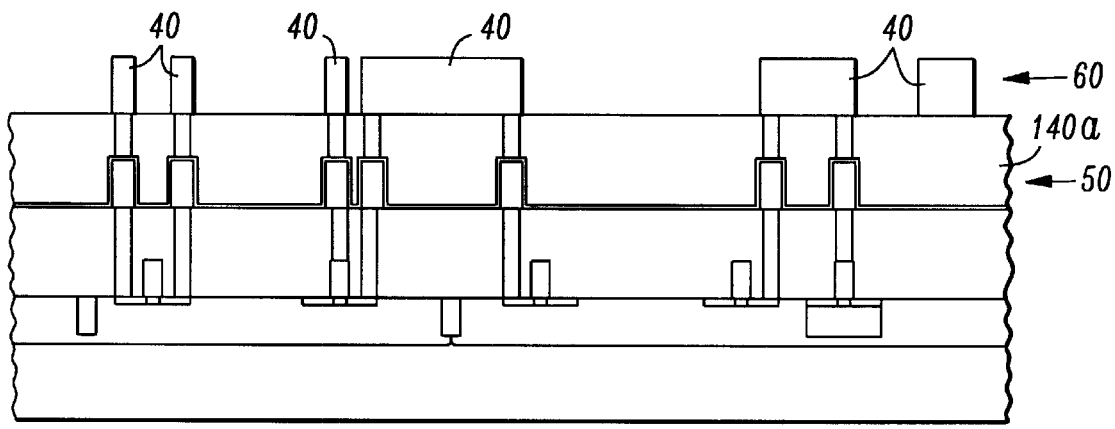

Formation of the structure 100 (FIG. 8) according to a subtractive metal etch process is illustrated in FIGS. 2–8 The following description for the first lower level of interconnect is applicable to each subsequent level of interconnect. Accordingly, formation of subsequent metallization levels is not described in detail. After defining an underlying set of contacts 30 the first metallization level 50 is formed by a generally well known sequence such as a 400 C. sequential sputter to form a Ti/TiN stack (e.g., 37 nm of Ti, 60 nm of TiN), followed by an anneal and then a deposit 400 to 700 nm of Al/Cu alloy and 25 nm of TiN. With a standard pattern and etch process a group of interconnect members 40 are defined to form metallization level 50 as illustrated in FIG. 2. Over the interconnect level 50, and over subsequently formed levels 60, 70 and 80, a level of porous insulation is deposited. According to a preferred embodiment of the invention, once a metallization level is defined, the process of forming an insulative layer over the metallization level begins with a deposition surface layer conducive to creation of porous characteristics in a silicon oxide film. A suitable surface layer results from applying a $NH_3$ or $N_2O$ plasma treatment to deposit silicon nitride or a silicon oxynitride $[SiO_xN_y(H_2)]$. For example, a thin, essentially monatomic, layer 56 of $Si_3N_4$ or $SiO_xN_y$ is deposited over exposed portions of the insulator level 28. The plasma treatment may be performed at 10 Torr, with $NH_3$ or $N_2O$ flow at 100 sccm, 13.56 Mhz RF power at 100 to 1000 watts, a temperature of 200 to 400 C., with either $N_2$ or He diluent gas flow at about 1 to 2 slm. The layer 56 is shown in FIG. 3.

Next, a first of several porous silicon oxide dielectric layers 140 (designated 140a) is deposited according to the invention. The silicon oxide layers 140 (see also FIG. 8) may be formed by thermal CVD reaction of $O_3/O_2$ with TEOS. An exemplary TEOS deposition which results in a porous oxide is performed at 400 C. and 600 Torr with 1.5 slm He, 6 slm oxygen, including 10 percent $O_3$, and 300 sccm TEOS. See FIG. 4. Under these conditions the oxide will deposit at a rate of approximately 60 Å/min. The deposited layer 140a is then polished back in a conventional manner to provide the structure of FIG. 5.

A second level of contacts 30 is next formed in the porous low k dielectric layer 140 a to provide electrical connection between the completed metallization level and the next metallization level. As described for the first level of contacts, the second level of contacts are formed by first depositing a Ti barrier followed by deposition of TiN, and a W deposition. The deposited metal is then polished back to fully define the contacts 30. See FIG. 6.

The described sequence of process steps, as illustrated in FIGS. 2–6 is repeated as each additional metallization level 60, 70 and 80 is formed. See, for example, FIG. 7 which illustrates a second level 60 of metallization (comprising interconnect members 40) formed over the porous layer 140a and making electrical connection with underlying contacts 30. The structure 10 shown in FIG. 8 comprises four levels of metallization each covered with one of the porous oxide layers 140a, 140b, 140c or 140d. With formation of the upper-most metallization level 80 and associated contacts complete, the structure is coated with 200 nm to 1 micron of final passivation material (typically conventional $Si_3N_4$) and further contacts are made to provide for external connections.

Formation of the structure 200 (FIG. 19) according to a Damascene process is illustrated in FIGS. 9–18. The following description for the first level of interconnect is applicable to each subsequent level of interconnect. Accordingly, formation of subsequent metallization levels is not described in detail. After defining an underlying set of contacts 30 the process of forming an insulative layer over a metallization level begins with forming a deposition surface layer conducive to creation of a porous silicon oxide film. This layer may be formed with a $NH_3$ or $N_2O$ plasma treatment. For example, a thin, essentially monatomic, layer 236 of $Si_3N_4$ is deposited over exposed portions of the insulator level 28. Process details as described above for layer 56 (FIG. 3) are applicable. See FIG. 9.

Next, a first of multiple porous silicon oxide dielectric layers 240 (designated 240a) is deposited according to the invention. See FIG. 10. The silicon oxide layers 240 (see also FIG. 19) are formed by a thermal CVD reaction of $O_3/O_2$ with TEOS. An exemplary TEOS deposition which results in a porous oxide is performed at 400 C. and 600 Torr with 1.5 slm He, 6 slm oxygen (including 10 percent $O_3$) and 300 sccm TEOS. Under these conditions the oxide is known to deposit at a rate of approximately 60 Å/min.

A first lower-most level of metallization 260 is next formed in the porous low k dielectric layer 240a beginning with deposition of a silicon oxide layer. The silicon oxide layer is patterned and etched to form a hard mask 262 for a standard etch sequence to create openings through the porous layer 240a down to the $Si_3N_4$ layer 236. Interconnect members 40 of metallization level 260 are formed in the openings by first sputtering TaN and then electroplating with copper. Alternately, the TaN layer could be deposited over a Ta layer. The copper is then polished back to form the structure shown in FIG. 11. Subsequently, with the hard mask 262 remaining in place, a $Si_3N_4$ layer 264 is deposited thereover to again provide a deposition surface-conducive to creation of a porous silicon oxide film. As previously noted, such a layer may be alternately formed with a $N_2O$ plasma treatment, but for the embodiment shown in the figures a thin, essentially monatomic, layer 264 of $Si_3N_4$ is deposited. Process details are as described above for layer 236. See FIG. 12.

Figure 15:
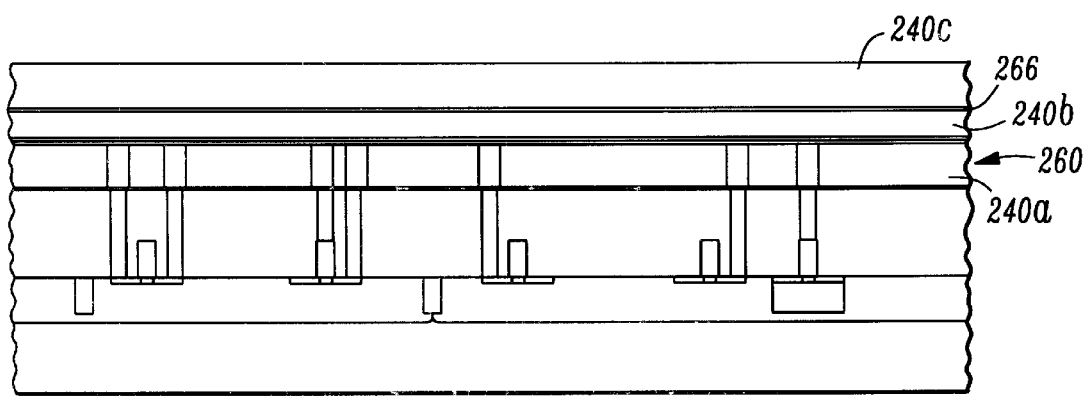

Another porous silicon oxide dielectric layer 240b is deposited according to the invention, e.g., by chemical vapor deposition of silicon oxide from TEOS as described above for layer 240a. Next, a $Si_3N_4$ layer 266 is deposited (as described for layer 264) over the porous layer 240b. Layer 266 assures presence of a deposition surface conducive to creation of a porous silicon oxide film (see FIG. 14) and porous silicon oxide dielectric layer 240c is deposited in a manner consistent with that described for layers 240a and 240b. FIG. 15 illustrates the layer 240c. A silicon oxide hard mask layer 268 is then deposited and patterned (as described for layer 262) in order to begin definition of dual Damascene metallization level 270. Initially, via openings 272 are etched through layer 240c, layer 266 and layer 240b, stopping on the $Si_3N_4$ layer 264. See FIG. 16. Then with additional photo mask patterning to remove portions of the hard mask layer 268 the metallization trenches 274 are etched. The etchant penetrates through the $Si_3N_4$ layer 264 and stops on the copper in the first metallization level 260. See FIG. 17. TaN is deposited in the via openings 272 and trenches 274 followed by copper plating and CMP to result in the completed metallization level 270 shown in FIG. 18.

Figure 19:
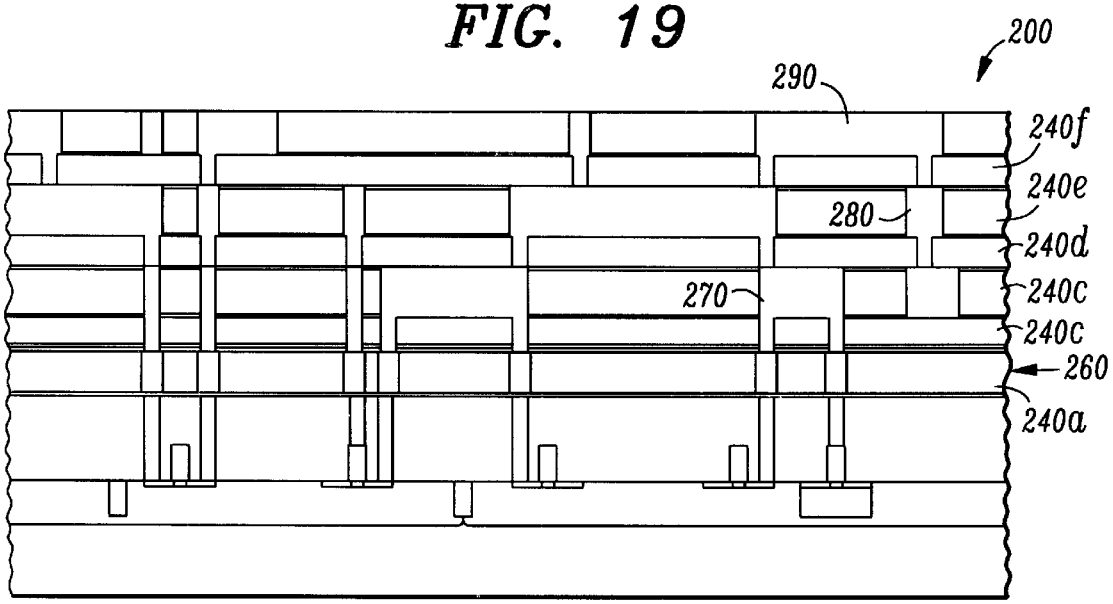

The process sequence described with reference to FIGS. 12–18 is repeated as additional metallization levels, e.g., level 280 and uppermost level 290, are formed to create the structure of FIG. 19. Although not illustrated, still more metallization levels incorporating porous oxide layers 240 are contemplated for structures of greater complexity. Further details regarding the etch chemistry and formation of metal to create the metallization levels 260, 270, 280 and 290 are well known. Exemplary details are described in copending U.S. patent applications Ser. Nos., 09/464,811 and 09/488,810. See also J. L. Yeh, et al., "Reverse Pillar Process: I. New Approaches to Interconnections in VLSI," AT &T Technical Memorandum 52168-871204-30TM, 1987; C. W. Kaanta, et al., "Dual Damascene: A ULSI Wiring Technology," 1991 IEEE VLSI Mutlilevel Interconnect Conference, pp. 144; and E. Barth, et al., "Integration of Copper and Fluorinated Silicate Glass for 0.18 um Interconnections," 2000 International Interconnect Technology Conference, pp. 219. With formation of metallization levels complete the dual Damascene structure is coated with a silicon nitride final passivation layer and further contacts are made to provide for external connections.

The aforedescribed porous silicon oxide layers, e.g., layers 140 and 240, are distinguishable from conventional TEOS-deposited compositions and ozonated TEOS-deposited layers. See Table 1 and Table 2.

TABLE 1

Composition of Porous Silicon Oxide (Atomic Percent)

| Constituent | Exemplary Composition | Expected Ranges of Constituents |
|---|---|---|
| Silicon | 23 | 25–30 |
| Oxygen | 58 | 50–75 |
| Carbon | 2 | 0.1–5 |
| Hydrogen | 12 | 5–15 |

TABLE 2

Exemplary Physical Characteristics For Embodiments of Porous Silicon Oxide Deposited According to the Invention

| | Low-k $O_3$ TEOS | |
|---|---|---|
| | Measured | Expected Range |
| Index of Refraction (for a wavelength between 633 nm and 673 nm) | 1.4357 | 1.4200 to 1.4500 possibly as low as 1.40 |
| Density | 1.3 g/cc | 1.1 g/cc to 1.8 g/cc possibly up to 2.0 g/cc. |
| Young's Modulus* | 18 GPa | 5 GPa to 30 GPa |
| Wet Etch Rate (relative to thermally grown $SiO_2$) with Dilute HF | 5:1 | 4:1 to 20:1 |
| Dielectric Constant (relative to free space) at 100 hz | 3.7 | 3.2 to 3.8, or lower. May range up to 4.1 |

*The Young's Modulus may range up to 45 GPa.

While the index of refraction and the density of porous silicon oxide layers deposited according to the invention are expected to vary (based in part on the level of porosity) specific values for the index of refraction for a wavelength between 633 nm and 673 nm are believed to range between 1.42 and 1.45; and range below typical values of plasma-deposited TEOS (n=1.459) and plasma-deposited ozonated TEOS (n=1.454) as well as thermally grown silicon dioxide (n=1.462) for a wavelength between 633 nm and 673 nm.

A feature of several embodiments of the invention is the specific sequential layering of dielectric materials in multi-level interconnect systems. As shown in FIG. 8 the relatively thick layers 140 of low k dielectric material are separated by relatively thin layers of dielectric material, e.g., silicon nitride layers 56 and 266. The layers 56 and 266 could be a silicon oxynitride resulting from deposition with $N_2O$ instead of $NH_3$.

Preferred embodiments of the invention include formation of a deposition surface layer, e.g., layers 56 and 266, believed to be conducive to creation of porous characteristics in the TEOS deposited low k films, but formation of such surface layers is not known to always be necessary for depositing a porous layer such as layer 140 or layer 240. For example, it may be possible to deposit the porous layer 240c over layer 240b without the intervening nitride layer 266 shown in FIG. 15.

The mechanisms for deposition of a porous insulator material may be several. In the case of providing a specific surface material, e.g., silicon nitride, conducive to formation of a porous layer, certain surface interaction properties may become prevalent and inhibit interaction with TEOS fragments so as to impede adsorption, as evidenced by a relatively low deposition rate of 500 to 700 nm/s.

The rate at which the oligomers are adsorbed on the surface appears dependent at least in part on the degree that the reaction environment is electronegative. A relatively large concentration of oxygen ions result from the ozone-rich gas mixture and react with the TEOS to form electronegative gaseous oligomers. The deposition surface is also electronegative. Increased ozone concentration or addition of fluorine can render the mixture even more electronegative and further impede the deposition rate. Thus, increased repulsion of the electronegative precursors by the electronegative substrate may increase the porosity of the silicon oxide.

The water by-product of TEOS decomposition also increases with ozone concentration. Increased amounts of water near the deposition surface may inhibit interaction of hydrophobic TEOS oligomers which must react at the surface to form the silicon oxide matrix.

In many embodiments of the invention, the TEOS-deposited silicon oxide layer, e.g, layer 140, has a continued distribution of voids throughout the majority of the layer volume. By continual distribution, it is meant that the average spacing between pores or voids in the porous layer is no more than one order of magnitude the average larger than cross sectional void width. The cross sectional void width is the width of a void when observed along a cross-section taken along a plane which passes through the layer. The average cross sectional void width is the average width of voids determined by measuring the width of many or all observable voids when observation is made along one or more cross sections each cross section taken along a plane passing through all or part of the porous layer. It is believed that in many embodiments of the invention, the average spacing between pores or voids can be substantially less than the average cross-sectional void width.

Cross sectional void composition means the percent area in a cross section taken along a plane passing through all or part of a porous layer formed according to the invention, which is not occupied by solid material. The cross-sectional void width should not extend beyond the limit of mechanical integrity requisite for associated fabrication requirements. It is preferred for the illustrated applications that the Young's Modulus be at least 5 GPa. In many embodiments of the invention, there is a continual distribution of voids ranging in maximum cross-sectional void width between 2 nm and 12 nm with an average cross-sectional width between 4 nm and 5 nm. However, the voids may have widths smaller than 0.5 nm.

Although constituents and characteristics for a preferred embodiment of porous insulator have been enumerated, combinations of other constituents with Si are expected to provide porous material with characteristics in ranges similar to those disclosed in Table 2. Specifically, oxygen need not be the predominant constituent, and the porous insulator may contain nitrogen as well as oxygen.

The invention may be most useful in complex semiconductor structures having four or more levels of interconnect such as microprocessors, digital signal processors or so called systems on a chip. Such devices, when fabricated with ULSI processes, e.g., geometries of 0.25 micron and less, will have circuit densities and electrical performance requirements which demand the low k properties achievable with the claimed invention.

In addition to providing low-k dielectric properties to insulators in low voltage integrated circuits, the porous insulator material can be applied in other semiconductor applications. For example, in power products the porous insulator can provide an energy dissipation path during over-voltage incidents. That is, the porous regions of the insulator material may impart a path for leakage current under high voltages. Such conduction paths will effect surge suppression in, for example, the 40v to 80v range. The characteristics of the porous insulator material may be modified to enhance conduction through or along the porous regions by inclusion of mobile ions, e.g., Na, or by inclusion of $H_2O$.

Although the invention has been described with regard to specific embodiments, these are only illustrative and the principles disclosed herein provide a basis for practicing the invention in a variety of ways on a variety of circuit structures. For the disclosed embodiments, Cu or Al is understood to be a primary constituent of the interconnect, but other interconnect materials are contemplated, including other elemental metals, alloys and conductive compounds, the choice depending on specific electrical, thermal and other physical properties desired for the application. The disclosed embodiments illustrate a silicon structure, but the invention may be practiced on semiconductor devices incorporating compound semiconductor materials including but not limited to materials such as Si-Ge, GaAs, and InGaAs. Still other constructions, although not described or referenced herein, do not depart from the scope of the invention which is only limited by the claims which follow.

We claim:

1. An insulator material comprising:
   oxygen, 25 to 35 atomic percent silicon, 5 to 15 atomic percent hydrogen, and carbon combined in a layer having a density less than 2 g/cc.

2. The material of claim 1 further characterized by a dielectric constant relative to free space less than 4.0 at 100 hz.

3. The material of claim 1 further characterized by an index of refraction less than 1.4500 for light having a wavelength between 633 nm and 673 nm.

4. The material of claim 1 further characterized by an index of refraction ranging between 1.400 and 1.45 for light having a wavelength between 633 and 673 nm.

5. The material of claim 1 further characterized by a Young's modulus between 5 GPa and 45 GPa.

6. The material of claim 1 further characterized by a wet etch ratio relative to thermally grown silicon dioxide between 4:1 and 20:1 with an etchant comprising a dilute form of HF.

7. The material of claim 1 further characterized by a continuous distribution of voids throughout the majority of the layer volume.

8. The material of claim 1 further including 0.1–5.0 atomic percent carbon.

9. A semiconductor structure comprising:
   a layer of semiconductor material having an upper surface;

a device formed along the upper surface;

an interconnect structure, providing electrical contact to the device, including a plurality of metallization levels each level comprising conductive elements; and at least one dielectric layer positioned to provide electrical isolation between portions of the conductive elements, the dielectric layer comprising: oxygen; at least 25 percent atomic silicon; 5 to 15 atomic percent hydrogen; and carbon, characterized by a refractive index less than 1.45 for light at a wavelength between 633 nm and 673 nm.

10. The semiconductor structure of claim 9 wherein said at least one dielectric layer has a refractive index between 1.35 and 1.50 at a wavelength between 633 nm and 673 nm and wherein the density is between 1.2 g/cc and 2 g/cc.

11. The semiconductor structure of claim 9 wherein said at least one dielectric layer has a density of 1.8 g/cc.

12. The semiconductor structure of claim 9 wherein said at least on layer comprises less than 75 atomic percent oxygen.

13. A semiconductor structure comprising:

a first upper level of interconnect having at least one conductive element formed over a semiconductor layer;

at least one lower level of interconnect having at least one conductive element formed between the semiconductor layer and the first upper level;

a first insulative material comprising: oxygen; at least 25 percent silicon; and at least 5 atomic percent hydrogen; and carbon, combined in a porous layer and having a density less than 2 g/cc, positioned to electrically isolate the conductive element of the first upper level from the conductive element of the lower level.

14. The structure of claim 13 characterized by a dielectric constant relative to free space less than 4.0 at 100 Hz and further including a lowest level of interconnect members formed between the lower level of interconnect members and the semiconductor layer.

15. The structure of claim 13 characterized by a dielectric constant relative to free spacing ranging between 3.2 and 3.8 at 100 Hz.

16. The semiconductor structure of claim 13 characterized by a refractive index between 1.420 and 1.450 at a wavelength between 633 and 673.

17. The semiconductor structure of claim 13 wherein the dielectric constant relative to free space of the first insulative material is approximately 3.7 at 100 Hz.

18. A semiconductor structure comprising:

an upper interconnect level having a conductive element formed over a semiconductor layer;

at least one lower interconnect level having a conductive element formed between the semiconductor layer and the first upper interconnect level; and a first insulative material comprising: at least 25 percent silicon; at least 50 atomic percent oxygen; 5 to 15 percent hydrogen; and carbon, characterized by a wet etch ratio relative to thermally grown silicon dioxide between 4:1 and 20:1 in an etchant comprising dilute HF, said first insulative material positioned to isolate the conductive element of the upper level from the conductive element of the lower level.

19. The structure of claim 18 wherein the density of the first insulative material ranges between 1.1 g/cc and 1.8 g/cc.

20. The semiconductor structure of claim 18 wherein the Young's modulus of the first insulative material is between 5 GPa and 30 GPa.

21. A semiconductor structure comprising:

a upper level of interconnect members formed over a semiconductor layer;

at least one lower level of interconnect members formed between the semiconductor layer and the first upper level;

a porous layer of insulative material comprising: oxygen; at least 25 atomic percent silicon; and 5 to 15 atomic percent hydrogen; and carbon, having a Young's modulus less than 45 GPa, said porous layer positioned to electrically isolate members of the first upper level from members of the lower level.

22. Method for manufacturing a semiconductor product comprising:

providing a semiconductor layer having an upper surface for;

forming multiple levels of interconnect each level including a plurality of members;

electrically isolating members from other members by decomposition of TEOS to form a form a dielectric layer of density less than 2 g/cc between at least some of the members.

23. The method of claim 22 wherein the decomposition of TEOS is performed in an oxygen-containing reaction environment and the oxygen comprises at least 10 percent ozone.

24. A method of claim 22 wherein the step of electrically isolating members from other members includes formation of a deposition surface conducive to provision of porous properties in the dielectric layer.

25. The method of claim 22 wherein the step of forming a deposition surface comprises deposition of a layer of silicon nitride.

26. The method of claim 22 wherein the step of depositing dielectric material by decomposition of TEOS is performed by depositing the dielectric material on a layer comprising silicon and nitrogen.

27. The method according to claim 22 wherein the dielectric material is deposited on a layer comprising silicon, nitrogen and oxygen.

28. A semiconductor structure comprising an upper level of interconnect members formed over a semiconductor layer;

at least one lower level of interconnect members formed between the semiconductor layer and first upper level; and a layer of insulative material comprising: oxygen; at least 25 atomic percent silicon; and 5 to 15 percent hydrogen; and carbon, having a continual distribution of voids throughout the majority of the layer volume.

29. The structure of claim 28 wherein the layer includes voids having cross-sectional widths greater than 3 nm.

30. The structure of claim 28 wherein the layer includes voids having cross-sectional widths between 3 and 10 nm.

* * * * *